United States Patent
Huh et al.

(10) Patent No.: US 8,415,666 B2
(45) Date of Patent: Apr. 9, 2013

(54) THIN FILM TRANSISTOR SUBSTRATE HAVING THIN FILM TRANSISTORS WITH IMPROVED ETCHING CHARACTERISTICS, METHOD OF MANUFACTURING THE SAME, AND DISPLAY APPARATUS HAVING THE SAME

(75) Inventors: Jong-Moo Huh, Hwaseong-si (KR); Joon-Hoo Choi, Seoul (KR)

(73) Assignee: Samsung Display Co., Ltd. (KR)

( * ) Notice: Subject to any disclaimer, the term of this patent is extended or adjusted under 35 U.S.C. 154(b) by 330 days.

(21) Appl. No.: 12/405,978

(22) Filed: Mar. 17, 2009

(65) Prior Publication Data
US 2009/0302325 A1 Dec. 10, 2009

(30) Foreign Application Priority Data
Jun. 9, 2008 (KR) .................. 10-2008-0053768

(51) Int. Cl.
*H01L 33/00* (2010.01)
(52) U.S. Cl. ....... 257/59; 257/66; 257/72; 257/E33.053; 257/E29.294
(58) Field of Classification Search .............. 257/66, 257/72, 59, E21.414, E33.053, E29.294
See application file for complete search history.

(56) References Cited

U.S. PATENT DOCUMENTS

| | | | | |
|---|---|---|---|---|
| 5,981,972 A | * | 11/1999 | Kawai et al. | 257/59 |
| 2002/0076845 A1 | * | 6/2002 | Noritake et al. | 438/30 |
| 2005/0088581 A1 | * | 4/2005 | Lai | 349/43 |
| 2009/0026456 A1 | * | 1/2009 | Nakamura | 257/59 |
| 2010/0022041 A1 | * | 1/2010 | Lee et al. | 438/29 |

FOREIGN PATENT DOCUMENTS

| | | |
|---|---|---|
| JP | 08-032083 | 2/1996 |
| JP | 08-181320 | 7/1996 |
| JP | 09-008311 | 1/1997 |

* cited by examiner

*Primary Examiner* — Thanh Nguyen
(74) *Attorney, Agent, or Firm* — Innovation Counsel LLP

(57) ABSTRACT

In a thin film transistor substrate, an active pattern of a thin film transistor includes a lower semiconductor pattern and an upper semiconductor pattern that are patterned through different process steps. The lower semiconductor pattern defines a channel area of the thin film transistor, and the upper semiconductor pattern is connected to a side portion of the lower semiconductor pattern and makes contact with the source electrode and the drain electrode. An etch stop layer is formed on the lower semiconductor pattern corresponding to the channel area, and the etch stop layer is formed through the same patterning process as the lower semiconductor pattern. Also, an ohmic contact pattern is formed on the upper semiconductor pattern, and the ohmic contact pattern is formed by the same patterning process as the upper semiconductor pattern.

11 Claims, 7 Drawing Sheets

THIN FILM TRANSISTOR SUBSTRATE HAVING THIN FILM TRANSISTORS WITH IMPROVED ETCHING CHARACTERISTICS, METHOD OF MANUFACTURING THE SAME, AND DISPLAY APPARATUS HAVING THE SAME

CROSS-REFERENCE TO RELATED APPLICATION

This application claims priority to Korean Patent Application No. 2008-53768 filed on Jun. 9, 2008, the contents of which are herein incorporated by reference in their entirety.

BACKGROUND

1. Field of the Invention

The present invention relates generally to thin film transistors. The present invention relates more specifically to a thin film transistor substrate on which a thin film transistor having improved characteristics is arranged, a display apparatus having the thin film transistor substrate, and a method of manufacturing the thin film transistor substrate.

2. Description of the Related Art

In general, a thin film transistor substrate includes at least one thin film transistor (TFT) formed thereon. The TFT switches signals that are transmitted through wires arranged on the substrate.

The TFT typically includes a gate electrode, a source electrode, a drain electrode, and a semiconductor pattern that defines a channel area. Also, the TFT typically includes an etch stop layer that is arranged on the semiconductor pattern. The etch stop layer prevents the semiconductor pattern from being over-etched when other layers are formed on the semiconductor pattern.

However, if the etch stop layer is formed on the semiconductor pattern by a photolithography process after the semiconductor pattern is formed, the semiconductor pattern commonly becomes over-etched. Thus, when the etch stop layer is formed, a material having a higher etch selectivity than that of the semiconductor pattern is often desirable for the etch stop layer.

SUMMARY OF THE INVENTION

An exemplary embodiment of the present invention provides a thin film transistor substrate having improved characteristics.

Another exemplary embodiment of the present invention provides a display apparatus having the thin film transistor substrate.

Another exemplary embodiment of the present invention provides a method of manufacturing the thin film transistor substrate.

In an exemplary embodiment of the present invention, a thin film transistor substrate includes a substrate, a lower semiconductor pattern arranged on the substrate, an etch stop layer arranged on the lower semiconductor pattern, an upper semiconductor pattern arranged on the etch stop layer, a source electrode arranged on the upper semiconductor pattern, a drain electrode arranged on the upper semiconductor pattern and spaced apart from the source electrode, and a gate electrode arranged on or under the lower semiconductor pattern to overlap the lower semiconductor pattern.

In another exemplary embodiment of the present invention, a method of manufacturing a thin film transistor substrate is provided as follows. A lower semiconductor pattern is formed on a substrate, an etch stop layer is formed on the lower semiconductor pattern, and an upper semiconductor pattern is formed on the etch stop layer. After forming the upper semiconductor pattern, a source electrode and a drain electrode spaced apart from each other are formed on the upper semiconductor pattern, and a gate electrode is formed on or under the lower semiconductor pattern to allow the lower semiconductor pattern to be overlapped with the lower semiconductor pattern.

In accordance with another exemplary embodiment of the present invention, a display apparatus includes a first substrate, a second substrate facing the first substrate, a thin film transistor arranged on the first substrate, and a pixel arranged on the first substrate and electrically connected to the thin film transistor. The thin film transistor includes a substrate, a lower semiconductor pattern arranged on the substrate, an etch stop layer arranged on the lower semiconductor pattern, an upper semiconductor pattern arranged on the etch stop layer, a source electrode arranged on the upper semiconductor pattern, a drain electrode arranged on the upper semiconductor pattern and spaced apart from the source electrode, and a gate electrode arranged on or under the lower semiconductor pattern to overlap the lower semiconductor pattern.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF EMBODIMENTS OF THE INVENTION

Figure 1:
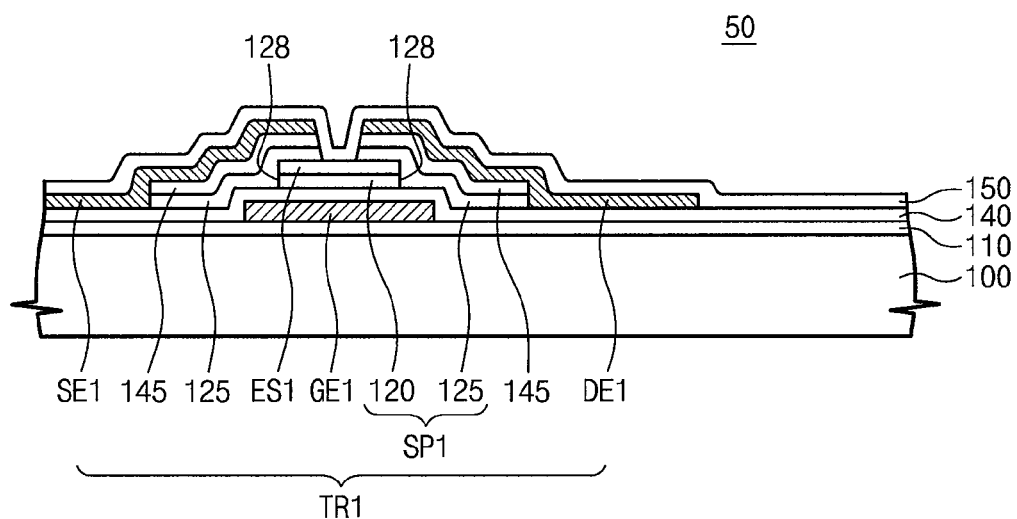
FIG. 1 is a cross-sectional view showing a first thin film transistor substrate according to an exemplary embodiment of the present invention.

It will be understood that when an element or layer is referred to as being "on", "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a cross-sectional view showing a first thin film transistor substrate according to an exemplary embodiment of the present invention. Referring to FIG. 1, a first thin film transistor substrate 50 includes a substrate 100, a buffer layer 110 arranged on the substrate 100, and a first thin film transistor TR1 arranged on the buffer layer 110.

The buffer layer 110 includes an insulating material such as silicon oxide (SiOx) or silicon nitride (SiNx), and the buffer layer 110 may have a thickness of about 500 angstroms to about 3000 angstroms.

The first thin film transistor TR1 includes a first gate electrode GE1, a first semiconductor pattern SP1, a first etch stop layer ES1, a first ohmic contact pattern 145, a first source electrode SE1, and a first drain electrode DE1.

The first gate electrode GE1 is arranged on the buffer layer 110. In the embodiment shown, the first thin film transistor TR1 is a bottom-gate type thin film transistor, so that the first gate electrode GE1 is positioned at a lowermost portion of the first thin film transistor TR1.

The first semiconductor pattern SP1 is arranged on the first gate electrode GE1 while interposing a first insulating layer 140 therebetween. The first semiconductor pattern SP1 includes a first lower semiconductor pattern 120 and a first upper semiconductor pattern 125.

The first lower semiconductor pattern 120 is positioned corresponding to an area where the first source electrode SE1 and the first drain electrode DE1 are spaced apart from each other to define a channel area of the first thin film transistor TR1.

The first upper semiconductor pattern 125 is arranged on the first lower semiconductor pattern 120, with the first etch stop layer ES1 interposed therebetween to cover the first lower semiconductor pattern 120. Therefore, the first upper semiconductor pattern 125 makes contact with side portions 128 of the first lower semiconductor pattern 120. In addition, the first upper semiconductor pattern 125 overlaps the first source electrode SE1 and the first drain electrode DE1, and thus the first semiconductor pattern SP1 makes contact with the first source electrode SE1 and the first drain electrode DE1 at the edges of pattern 125.

The first upper semiconductor pattern 125 and the first lower semiconductor pattern 120 may include the same material, which can include amorphous silicon or crystalline silicon. In case that the first upper semiconductor pattern 125 and the first lower semiconductor pattern 120 include crystalline silicon, the first upper semiconductor pattern 125 and the first lower semiconductor pattern 120 may have a thickness of about 300 angstroms to about 2000 angstroms, and more particularly, of about 300 angstroms to about 800 angstroms.

The first upper semiconductor pattern 125 and the first lower semiconductor pattern 120 can be formed through different process steps. Thus, the first upper semiconductor pattern 125 and the first lower semiconductor pattern 120 are separately illustrated in FIG. 1. However, even if the first upper semiconductor pattern 125 and the first lower semiconductor pattern 120 are formed through different process steps, the first upper semiconductor pattern 125 may be integrally combined with (i.e., placed in electrical contact with) the first lower semiconductor pattern 120 at the side portion 128 of the first lower semiconductor pattern 120.

Therefore, when a gate signal is applied to the first gate electrode GE1, the first upper semiconductor pattern 125 and the first lower semiconductor pattern 120 are activated, so that electrons may be transferred between the first upper semiconductor pattern 125 and the first lower semiconductor pattern 120. As a result, the first semiconductor pattern SP1, including the first upper semiconductor pattern 125 and the first lower semiconductor pattern 120, may be operated as an active pattern of the first thin film transistor TR1.

The first etch stop layer ES1 is arranged on the first lower semiconductor pattern 120. The first etch stop layer ES1 includes an insulating material such as silicon nitride or silicon oxide, and has a thickness of about 100 angstroms to about 3000 angstroms. When other layers above the first lower semiconductor pattern 120 are etched, the first etch stop layer ES1 may prevent the first lower semiconductor pattern 120 from being over-etched, thereby uniformly maintaining the thickness of the first lower semiconductor pattern 120.

In the present exemplary embodiment, the first lower semiconductor pattern 120 has a same shape as the first etch stop layer ES1 in a plan view, since the first lower semiconductor pattern 120 and the first etch stop layer ES1 are patterned using a same mask pattern as an etching mask. Although not shown in FIG. 1, the first lower semiconductor pattern 120 and the first etch stop layer ES1 may also have different shapes from each other.

The first ohmic contact pattern 145 is arranged between the first upper semiconductor pattern 125 and the first source electrode SE1, and between the first upper semiconductor pattern 125 and the first drain electrode DE1. The first ohmic contact pattern 145 can include n+ amorphous silicon or n+ crystalline silicon.

In the present exemplary embodiment, the first ohmic contact pattern 145 has a same shape as the first upper semiconductor pattern 125 in a plan view, since the first ohmic contact pattern 145 and the first upper semiconductor pattern 125 are patterned using the same etching mask. However, the first ohmic contact pattern 145 and the first upper semiconductor pattern 125 may also be patterned in different process steps, and thus the first ohmic contact pattern 145 and the first upper semiconductor pattern 125 may have different shapes.

Also, in the present exemplary embodiment, the first thin film transistor TR1 is shown as including the first ohmic contact pattern 145. However, this need not necessarily be the case. In the case that the first thin film transistor TR1 does not include the first ohmic contact pattern 145, the first upper semiconductor pattern 125 may include an impurity-doped conductive material such as n+ amorphous silicon or n+ crystalline silicon.

The first source electrode SE1 and the first drain electrode DE1 are arranged on the first ohmic contact pattern 145. The first source electrode SE1 and the first drain electrode DE1 are spaced apart from each other, and a second insulating layer 150 is arranged on the first source electrode SE1 and the first drain electrode DE1.

In the present exemplary embodiment, the first source electrode SE1 and the first drain electrode DE1 have different shapes from those of the first ohmic contact pattern 145 and the first upper semiconductor pattern 125 in a plan view. However, the first source electrode SE1 and the first drain electrode DE1 may be patterned using the same mask pattern as that applied to form the first ohmic contact pattern 145 and the first upper semiconductor pattern 125. Accordingly, the first source electrode SE1 and the first drain electrode DE1 may also have the same shape as the first ohmic contact pattern 145 and the first upper semiconductor pattern 125 in a plan view.

Figure 2:
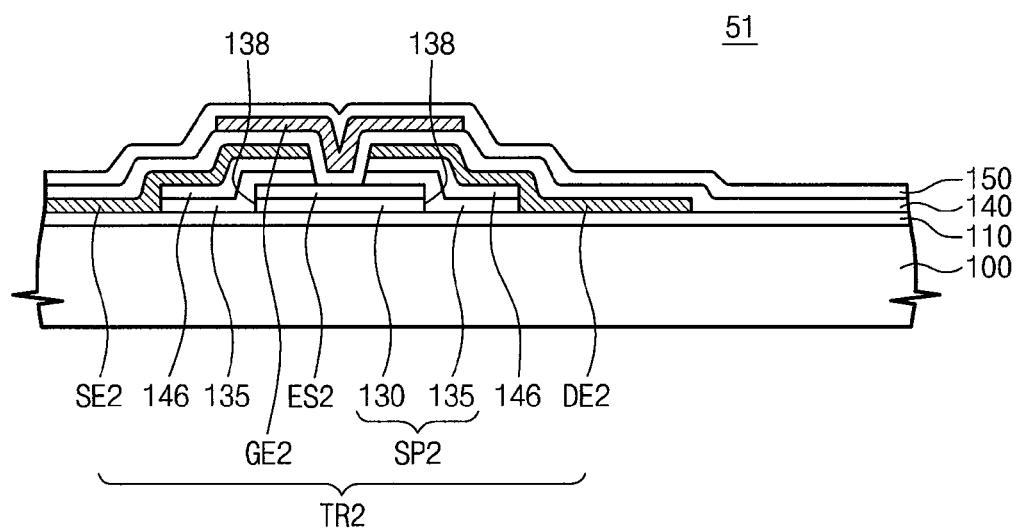
FIG. 2 is a cross-sectional view showing a second thin film transistor according to another exemplary embodiment of the present invention.

FIG. 2 is a cross-sectional view showing a second thin film transistor according to another exemplary embodiment of the present invention. The first thin film transistor TR1 (shown in FIG. 1) is a bottom-gate type thin film transistor, and a second thin film transistor TR2 (shown in FIG. 2) is a top-gate type thin film transistor. That is, the first gate electrode GE1 (shown in FIG. 1) formed on the first thin film transistor substrate 50 is positioned at the lowermost portion of the first thin film transistor TR1, whereas a second gate electrode GE2 (shown in FIG. 2) formed on the second thin film transistor substrate 51 is positioned at an uppermost portion of the second thin film transistor TR2.

Although the first thin film transistor TR1 and the second thin film transistor TR2 may be classified as a bottom-gate type thin film transistor and a top-gate type thin film transistor respectively, in many respects, the function, structure, and material of the components of the second thin film transistor TR2 are substantially the same as those of the components of the first thin film transistor TR1. Thus, a detailed description of the second thin film transistor TR2 will be only briefly provided for FIG. 2.

Referring to FIG. 2, the second thin film transistor substrate 51 includes a substrate 100, a buffer layer 110 arranged on the substrate 100, and a second thin film transistor TR2 arranged on the buffer layer 110.

The second thin film transistor TR2 includes a second semiconductor pattern SP2, a second etch stop layer ES2, a second ohmic contact pattern 146, a second source electrode SE2, a second drain electrode DE2, and a second gate electrode GE2. The second thin film transistor TR2 is a top-gate type thin film transistor, and thus the second gate electrode GE2 is positioned at the uppermost portion of the second thin film transistor TR2.

The second semiconductor pattern SP2 is arranged on the buffer layer 110. The second semiconductor pattern SP2 includes a second lower semiconductor pattern 130 and a second upper semiconductor pattern 135.

The second lower semiconductor pattern 130 is positioned corresponding to an area where the second source electrode SE2 and the second drain electrode DE2 are spaced apart from each other to define a channel area of the second thin film transistor TR2.

The second upper semiconductor pattern 135 is arranged on the second lower semiconductor pattern 130 while interposing the second etch stop layer ES2 therebetween to at least partially cover the second lower semiconductor pattern 130. Thus, the second upper semiconductor pattern 135 makes contact with side portions 138 of the second lower semiconductor pattern 130. In addition, the second upper semiconductor pattern 135 overlaps the second source electrode SE2 and the second drain electrode DE2, and thus the second semiconductor pattern SP2 makes contact with the second source electrode SE2 and the second drain electrode DE2 at the edges of pattern 135.

The second upper semiconductor pattern 135 and the second lower semiconductor pattern 130 can be formed through different process steps. Therefore, the second upper semiconductor pattern 135 and the second lower semiconductor pattern 130 are separately illustrated in FIG. 2. However, even if the second upper semiconductor pattern 135 and the second lower semiconductor pattern 130 are formed through different process steps, the second upper semiconductor pattern 135 may be integrally combined with (i.e., placed in electrical contact with) the second lower semiconductor pattern 130 at the side portions 138 of the second lower semiconductor pattern 130.

Thus, when a gate signal is applied to the second gate electrode GE2, the second upper semiconductor pattern 135 and the second lower semiconductor pattern 130 are activated, so that electrons may be transferred between the second upper semiconductor pattern 135 and the second lower semiconductor pattern 130. As a result, the second semiconductor pattern SP2 may serve as an active pattern of the second thin film transistor TR2.

The second etch stop layer ES2 is arranged on the second lower semiconductor pattern 130. The second etch stop layer ES2 prevents the second lower semiconductor pattern 130 from being over-etched, thereby uniformly maintaining the thickness of the second lower semiconductor pattern 130.

The second ohmic contact pattern 146 is arranged between the second upper semiconductor pattern 135 and the second source electrode SE2, and between the second upper semiconductor pattern 135 and the second drain electrode DE2.

The second source electrode SE2 and the second drain electrode DE2, which are spaced apart from each other, are arranged on the second ohmic contact pattern 146. Also, a first insulating layer 140 is arranged on the second source electrode SE2 and the second drain electrode DE2.

The second gate electrode GE2 is arranged on the first insulating layer 140 to overlap the second lower semiconductor pattern 130. Also, a second insulating layer 150 that covers the second thin film transistor TR2 is arranged on the second gate electrode GE2.

FIGS. 3 to 8 are process views showing a manufacturing process of the first thin film transistor substrate of FIG. 1. In FIGS. 3 to 8, the same reference numerals denote the same elements in FIG. 1, and thus the detailed descriptions of the same elements will be omitted.

Figure 3:
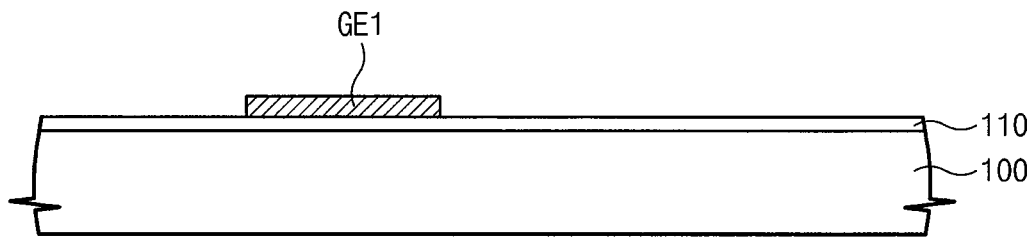
FIGS. 3 to 8 are process views showing a manufacturing process of the first thin film transistor substrate shown in FIG. 1.

Referring to FIG. 3, the buffer layer 110 is formed on the substrate 100, and the first gate electrode GE1 is formed on the buffer layer 110. More particularly, the buffer layer 110 and a gate layer (not shown) are sequentially formed on the substrate 100, and the gate layer is patterned to form the first gate electrode GE1.

Figure 4:
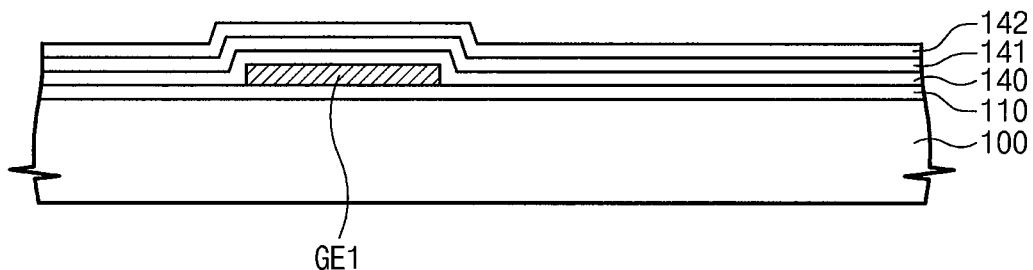
Figure 5:
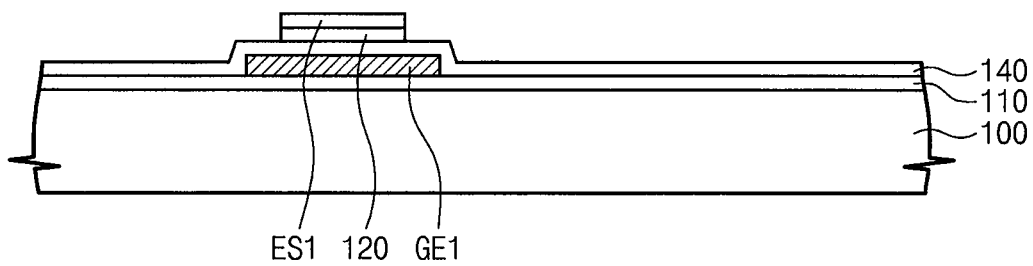

Referring to FIGS. 4 and 5, the first insulating layer 140, a first preliminary lower semiconductor layer 141, and a first preliminary etch stop layer 142 are sequentially formed on the buffer layer 110 and the first gate electrode GE1. The first insulating layer 140, the first preliminary lower semiconductor layer 141, and the first preliminary etch stop layer 142 may be formed through a chemical vapor deposition (CVD) method.

After the first preliminary lower semiconductor layer 141 and the first preliminary etch stop layer 142 are formed, the first preliminary lower semiconductor layer 141 and the first preliminary etch stop layer 142 are etched to form the first lower semiconductor pattern 120 and the first etch stop layer ES1, respectively. More particularly, a mask pattern (not shown) is formed on the first preliminary etch stop layer 142, and the first preliminary lower semiconductor layer 141 and the first preliminary etch stop layer 142 are substantially simultaneously etched using the mask pattern as an etching mask. Thus, the first lower semiconductor pattern 120 and the first etch stop layer ES1 are formed to have the same shape as each other in a plan view.

In general, in case that the first lower semiconductor pattern 120 and the first etch stop layer ES1 are formed through different etching process steps, the first lower semiconductor pattern 120 may be over-etched while the first preliminary etch stop layer 142 is etched to form the first etch stop layer ES1. Over-etching of the first lower semiconductor pattern 120 may compromise the operational characteristics of the thin film transistor, since the first lower semiconductor pattern 120 defines the channel area of the thin film transistor.

However, according to the present exemplary embodiment, since the first etch stop layer ES1 is patterned together with the first lower semiconductor pattern 120, the first lower semiconductor pattern 120 may be prevented from being over-etched, and the total number of process steps required to form the first etch stop layer ES1 and the first lower semiconductor layer 120 may decrease.

Figure 6:
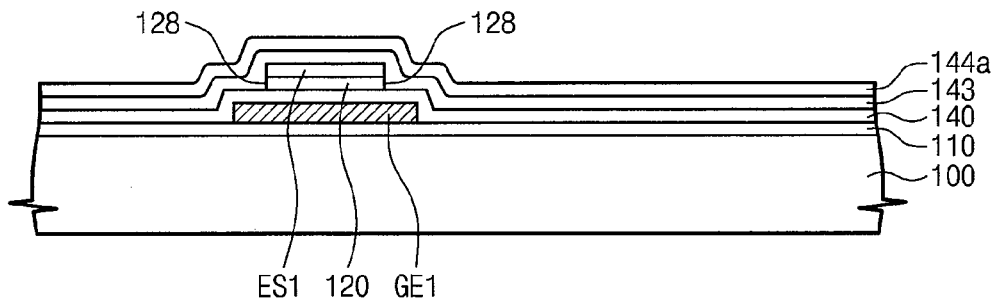

Referring to FIG. 6, a preliminary upper semiconductor layer 143 and a first preliminary ohmic contact layer 144a are sequentially formed on the first insulating layer 140 and the first etch stop layer ES1 through the above CVD method.

In FIG. 6, the first preliminary upper semiconductor layer 143 and the first lower semiconductor pattern 120 are shown as separate and distinct layers, since the first preliminary upper semiconductor layer 143 and the first lower semiconductor pattern 120 are formed through different process steps. However, since the first preliminary upper semiconductor layer 143 is formed through the above CVD method, the first preliminary upper semiconductor layer 143 may be integrally combined with the first lower semiconductor pattern 120 at the side portion 128 of the first lower semiconductor pattern 120.

Figure 7:
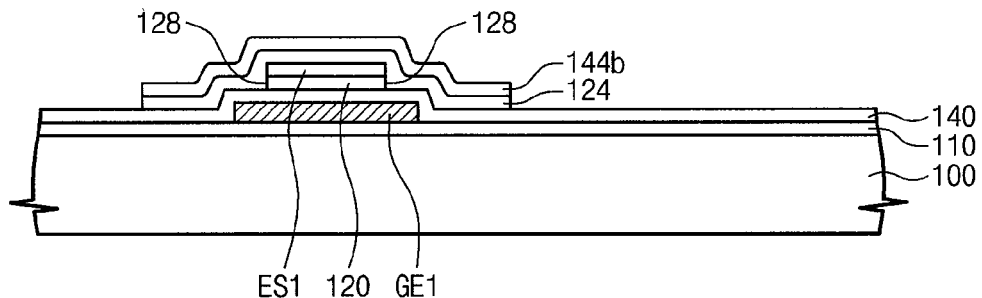

Referring to FIG. 7, the first preliminary upper semiconductor layer 143 (shown in FIG. 6) and the first preliminary ohmic contact layer 144a (shown in FIG. 6) are patterned to form a first preliminary upper semiconductor pattern 124 (shown in FIG. 7) and a first preliminary ohmic contact pattern 144b (shown in FIG. 7), respectively. More particularly, a mask pattern (not shown) is formed on the first preliminary ohmic contact layer 144a, and the first preliminary upper semiconductor layer 143 and the first preliminary ohmic contact layer 144a are substantially simultaneously patterned using the mask pattern as an etching mask. Thus, the first preliminary upper semiconductor pattern 124 and the first preliminary ohmic contact pattern 144b are formed to have the same shape as each other in a plan view.

Figure 8:
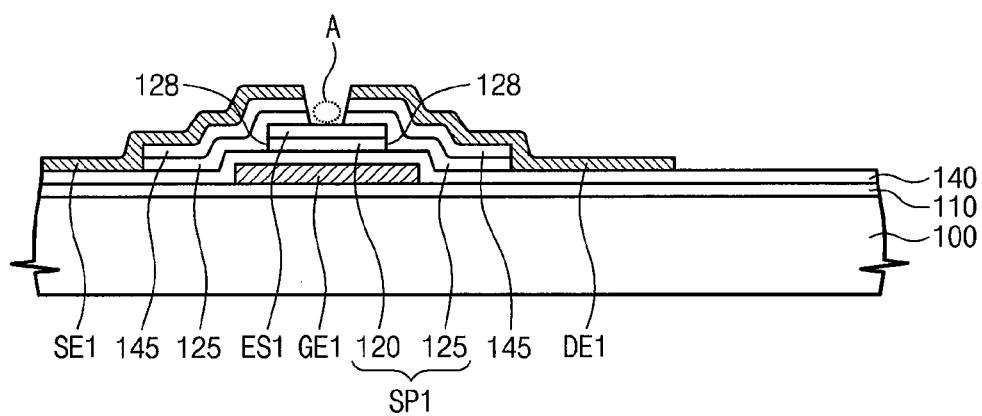

Referring to FIG. 8, the first source electrode SE1 and the first drain electrode DE1 are formed on the first ohmic contact pattern 145 so as to be spaced apart from each other. In detail, the first source electrode SE1 and the first drain electrode DEB are formed on the first preliminary ohmic contact pattern 144b (shown in FIG. 7). Then, the first preliminary ohmic contact pattern 144b (shown in FIG. 7) and the first preliminary upper semiconductor pattern 124 (shown in FIG. 7) are etched-back, using the first source electrode SE1 and the first drain electrode DE1 together as an etching mask, in order to remove an etching area A. During etching of the etching area A, the first etch stop layer ES1 prevents the first lower semiconductor pattern 120 from being over-etched.

Referring again to FIG. 1, the second insulating layer 150 is formed on first source electrode SE1 and the first drain electrode DE1. Thus, the first thin film transistor substrate 50 that includes the substrate 100 and the first thin film transistor TR1 arranged on the substrate 100 is completed.

In the present exemplary embodiment, the first source electrode SE1 and the first drain electrode DE1 are patterned using different etching masks from those masks used for the first preliminary upper semiconductor pattern 124 (shown in FIG. 7) and the first preliminary ohmic contact pattern 144b (shown in FIG. 7). However, the first source electrode SE1 and the first drain electrode DE1 may be patterned using the same etching mask as the first preliminary upper semiconductor pattern 124 and the first preliminary ohmic contact pattern 144b.

Referring again to FIGS. 6 and 7, in the case that the first source electrode SE1 and the first drain electrode DE1 are patterned using the same mask as the first preliminary upper semiconductor pattern 124 and the first preliminary ohmic contact pattern 144b, a preliminary source-drain layer (not shown) can be further formed on the first preliminary ohmic contact layer 144a, and then the first preliminary upper semiconductor layer 143, the first preliminary ohmic contact layer 144a, and the preliminary source-drain layer may be substantially simultaneously patterned using the same etching mask. The preliminary source-drain layer comprises source material of the first source electrode SE1 and the first drain electrode DE1, thus, the preliminary source-drain layer is etched to form the first source electrode SE1 and the first drain electrode DE1.

In the present exemplary embodiment of the present invention, as described above, the first preliminary ohmic contact pattern 144b (shown in FIG. 7) is etched-back using the first source electrode SE1 and the first drain electrode DE1 as an etching mask, thereby forming the first ohmic contact pattern 145.

While this embodiment shows the first ohmic contact pattern 145 as being formed under electrodes SE1 and DE1, this need not necessarily be the case. In some cases, pattern 145 need not be formed. Instead, a process of injecting impurities into the first upper semiconductor pattern 125 may be performed. In these cases, the upper surface of first upper semiconductor pattern 125 makes direct contact with the first source electrode SE1 and the first drain electrode DE1.

FIGS. 9 to 14 are process views showing a manufacturing process of the second thin film transistor substrate of FIG. 2. In FIGS. 9 to 14, the same reference numerals denote the same elements in FIG. 2, and thus the detailed descriptions of the same elements will be omitted.

Figure 9:
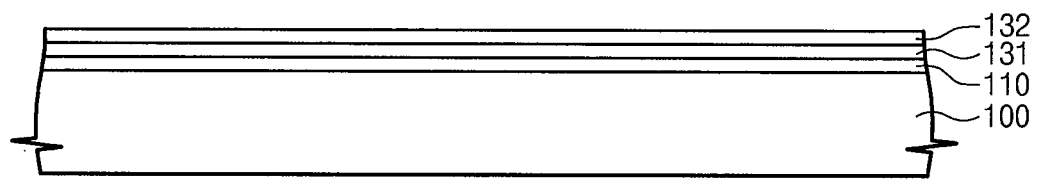
FIGS. 9 to 14 are process views showing a manufacturing process of the second thin film transistor substrate shown in FIG. 2.

Referring to FIG. 9, a buffer layer 110, a second preliminary lower semiconductor layer 131, and a second preliminary etch stop layer 132 are sequentially formed on the substrate 100 through a CVD method.

Figure 10:
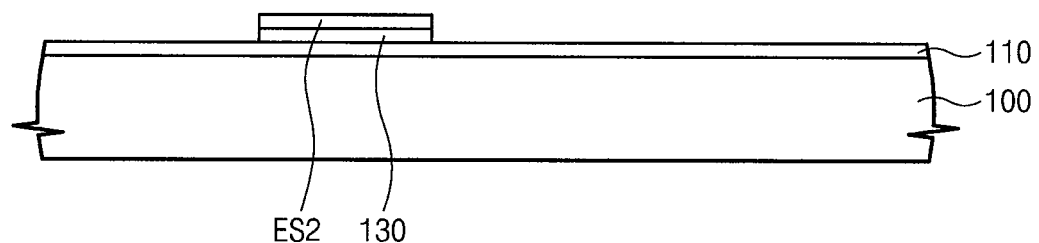

Referring to FIG. 10, the second preliminary etch stop layer 132 (shown in FIG. 9) and the second preliminary lower semiconductor layer 131 (shown in FIG. 9) are patterned to form the second etch stop layer ES2 (shown in FIG. 10) and the second lower semiconductor pattern 130 (shown in FIG. 10), respectively. More particularly, a mask pattern (not shown) is formed on the second preliminary etch stop layer 132, and the second preliminary lower semiconductor layer 131 and the second preliminary etch stop layer 132 are substantially simultaneously etched using the mask pattern as an etching mask. Thus, the second lower semiconductor pattern 130 and the second etch stop layer ES2 are formed to have the same shape as each other in a plan view.

Figure 11:
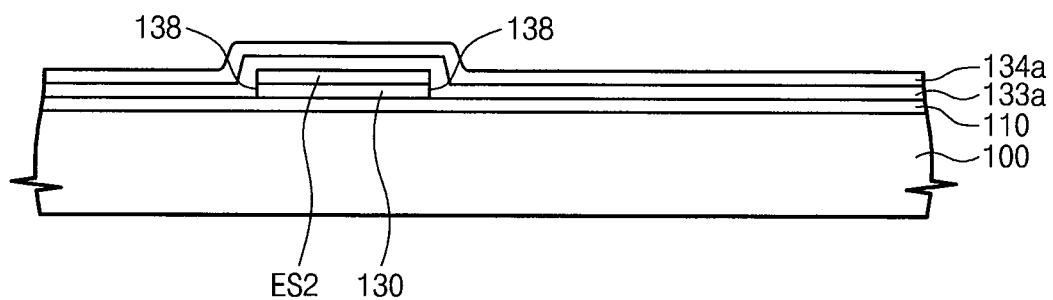

Referring to FIG. 11, a second preliminary upper semiconductor layer 133a and a second preliminary ohmic contact layer 134a are sequentially formed on the buffer layer 110 and the second etch stop layer ES2 through the above CVD method.

In FIG. 11, the second preliminary upper semiconductor layer 133a and the second lower semiconductor pattern 130 are shown as separate and distinct layers. However, as the second preliminary upper semiconductor layer 133a is formed through the above CVD method, the second preliminary upper semiconductor layer 133a may be integrally combined with the second lower semiconductor pattern 130 at the side portion 138 of the second lower semiconductor pattern 130.

Figure 12:
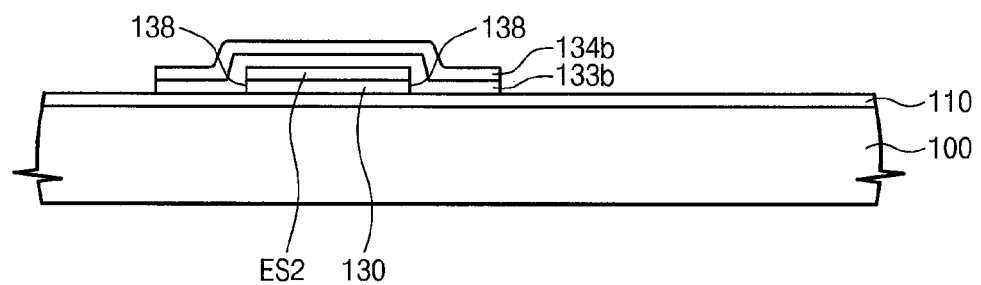

Referring to FIG. 12, the second preliminary upper semiconductor layer 133a (shown in FIG. 10) and the second preliminary ohmic contact layer 134a (shown in FIG. 10) are patterned to form a second preliminary upper semiconductor pattern 133b (shown in FIG. 12) and the second preliminary ohmic contact pattern 134b (shown in FIG. 12), respectively.

Figure 13:
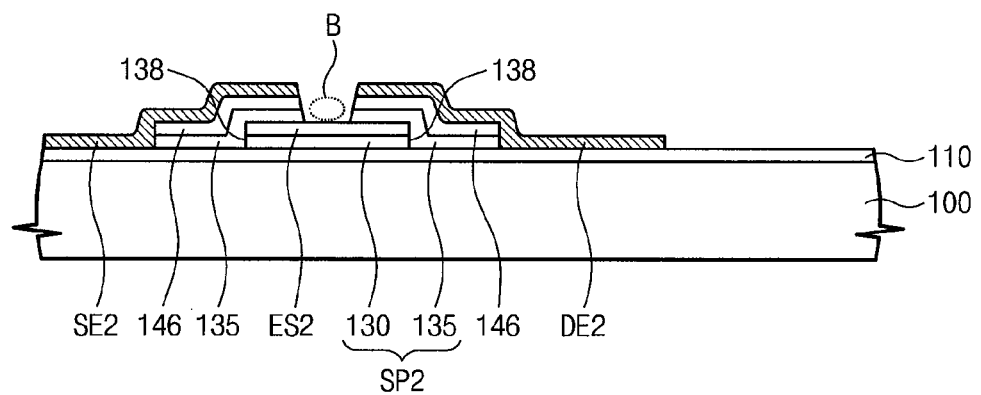

Referring to FIG. 13, the second source electrode SE2 and the second drain electrode DE2 are formed on the second ohmic contact pattern 146. More particularly, the second source electrode SE2 and the second drain electrode DE2 are formed on the second preliminary ohmic contact pattern 134b (shown in FIG. 12). Then, the second preliminary ohmic contact pattern 134b (shown in FIG. 12) and the second preliminary upper semiconductor pattern 133b (shown in FIG. 12) are etched-back using the second source electrode SE2 and the second drain electrode DE2 as an etching mask in order to remove an etching area B. When the etching area B is etched, the second etch stop layer ES2 may prevent the second lower semiconductor pattern 130 from being over-etched.

Figure 14:
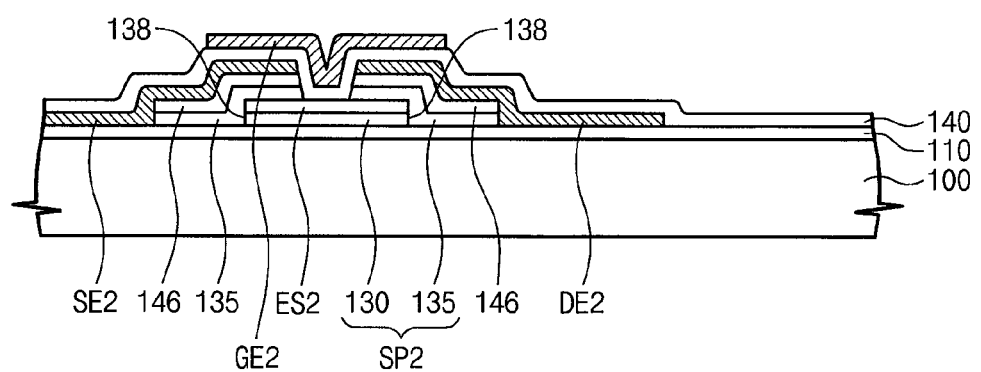

Referring to FIG. 14, the first insulating layer 140 is formed on the second source electrode SE2 and the second drain electrode DE2, and the second gate electrode GE2 is formed on the first insulating layer 140. As described above, the second thin film transistor TR2 is a top-gate type thin film transistor, so that the second gate electrode GE2 is positioned at the uppermost portion of the second thin film transistor TR2.

Referring again to FIG. 2, the second insulating layer 150 is formed on the second thin film transistor TR2, thereby completing manufacturing of the second thin film transistor substrate 51.

Figure 15:
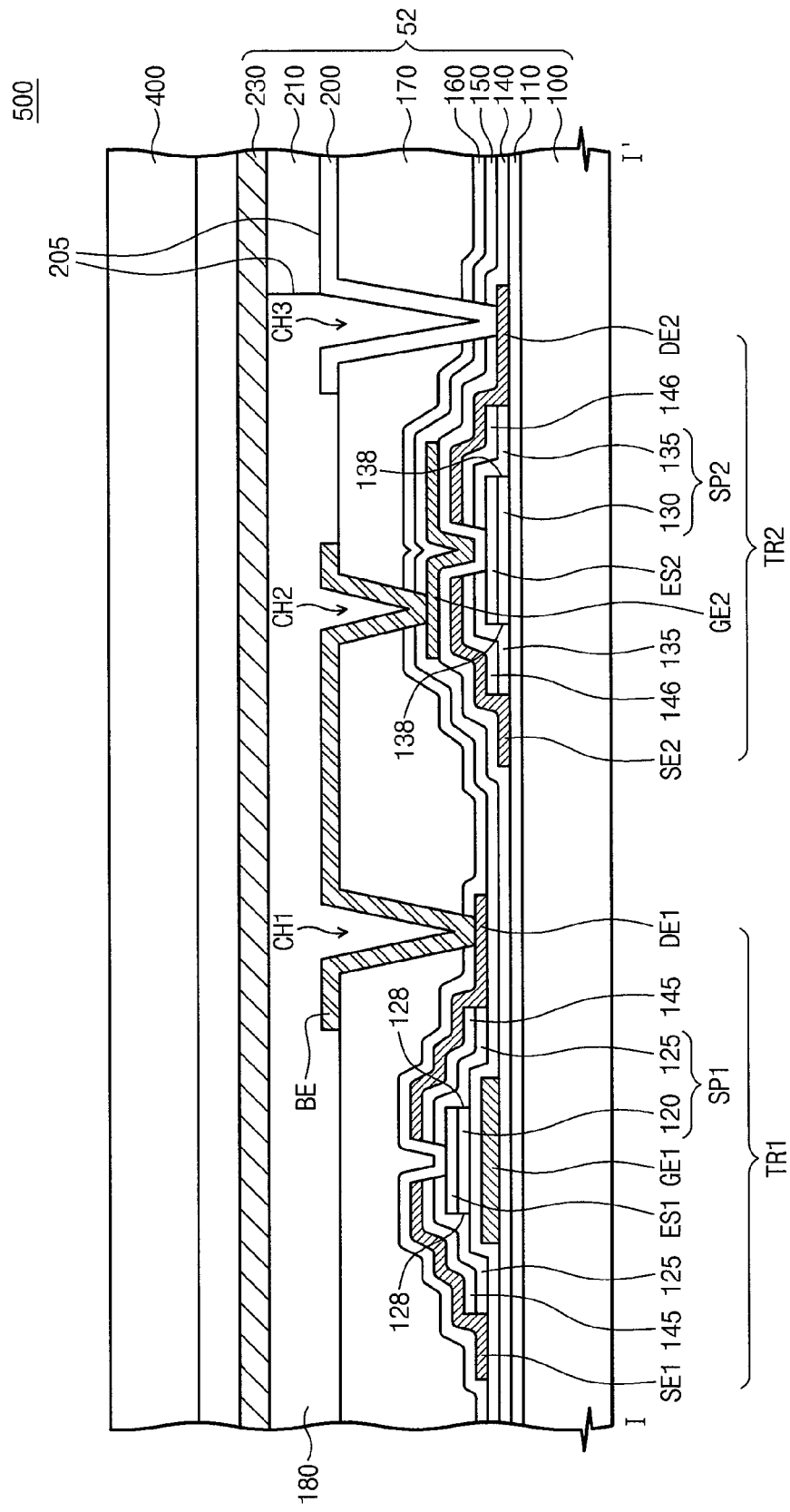
FIG. 15 is a cross-sectional view showing an exemplary embodiment of an organic light emitting display according to the present invention.

FIG. 15 is a cross-sectional view showing an exemplary embodiment of an organic light emitting display according to the present invention. More particularly, FIG. 15 shows one pixel of a plurality of pixels formed on the organic light emitting display. Also, a third thin film transistor 52 shown in FIG. 15 includes the first thin film transistor TR1 (shown in FIG. 1) and the second thin film transistor TR2 (shown in FIG. 2) arranged thereon. Therefore, the same reference numerals denote the same elements in FIGS. 1 and 2, and thus the detailed descriptions of the same elements will be omitted.

Referring to FIG. 15, an organic light emitting display 500 includes a third thin film transistor substrate 52 and an opposite substrate 400.

The third thin film transistor substrate 52 includes a first thin film transistor TR1, a second thin film transistor TR2, a first electrode 200, a second electrode 230, and an organic light emitting layer 210.

The first thin film transistor TR1 is electrically connected to the second thin film transistor TR2. In detail, a first drain electrode DE1 is electrically connected to a connection electrode BE through a first contact hole CH1 that is formed through a third insulating layer 170. Additionally second gate electrode GE2 is electrically connected to the connection electrode BE through a second contact hole CH2 that is formed through the third insulating layer 170. Also, the first electrode 200 is electrically connected to a second drain electrode DE2 through a third contact hole CH3, which is formed through layers above the second drain electrode DE2.

Meanwhile, a bank pattern 180 is arranged on the third insulating layer 170, and an opening 205 is formed through the bank pattern 180. The organic light emitting layer 210 is contained inside the opening 205 to be positioned on the first electrode 200. Also, the second electrode 230 is arranged on the bank pattern 180 and the organic light emitting layer 210.

Although not shown in FIG. 15, a gate line, a data line, and a power supply line are arranged on the third thin film transistor substrate 52. The first gate electrode GE1 is branched from the gate line, the first source electrode SE1 is branched from the data line, and the second source electrode SE2 is branched from the power supply line.

Thus, when a gate signal is applied from the gate line to the first gate electrode GE1, the first semiconductor pattern SP1 (including the first lower semiconductor pattern 120 and the first upper semiconductor pattern 125) is activated by the gate signal, thereby turning on the first thin film transistor TR1. When the first thin film transistor TR1 is turned on, a data signal applied from the data line to the first source electrode SE1 is provided to the first drain electrode DE1 through the first semiconductor pattern SP1.

In addition, the data signal applied to the first drain electrode DE1 is provided to the second gate electrode GE2 through the connection electrode BE. As the data signal is applied to the second gate electrode GE2, the second semiconductor pattern SP2 including the second upper semiconductor pattern 135 and the second lower semiconductor pattern 130 is activated, to thereby turn on the second thin film transistor TR2. When the second thin film transistor TR2 is turned on, a driving voltage applied from the power supply line to the second source electrode SE2 is provided to the second drain electrode DE2 through the second semiconductor pattern SP2.

Consequently, the driving voltage applied to the second drain electrode DE2 is provided to the first electrode 200, and the organic light emitting layer 210 may generate light in response to the driving voltage and a common voltage applied to the second electrode 230.

Figure 16:
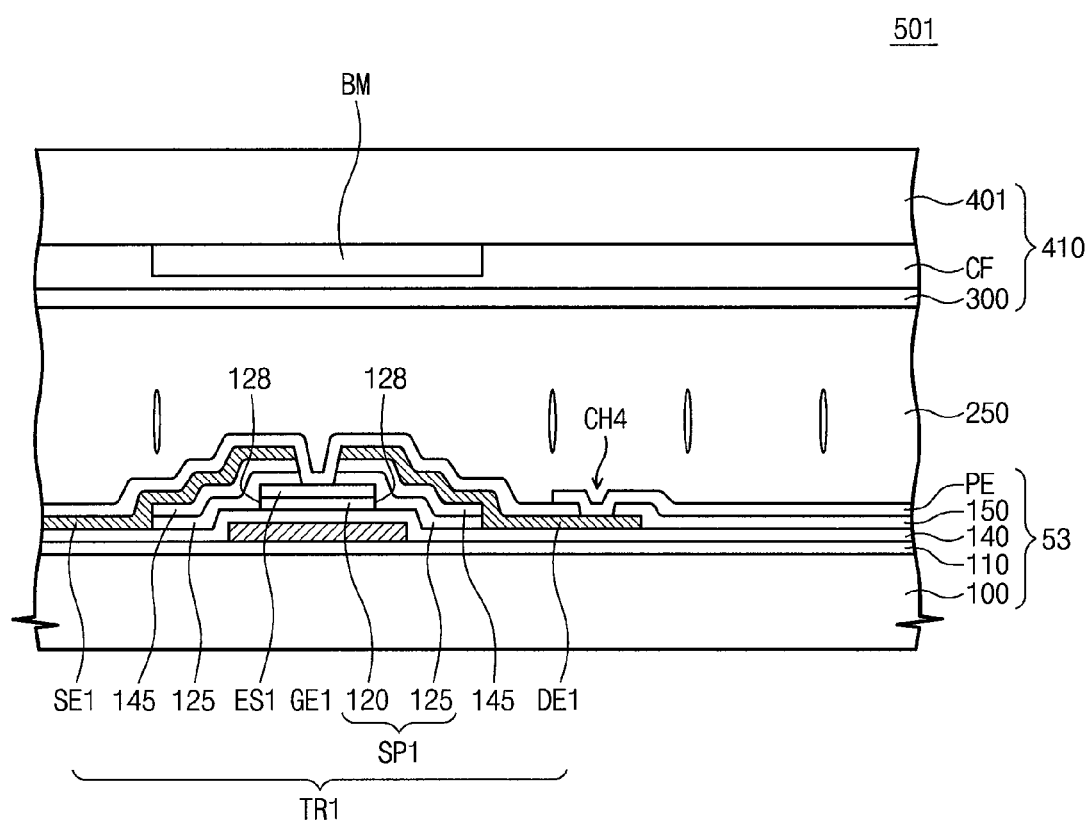
FIG. 16 is a cross-sectional view showing an exemplary embodiment of a liquid crystal display according to the present invention.

FIG. 16 is a cross-sectional view showing an exemplary embodiment of a liquid crystal display according to the present invention. More particularly, FIG. 16 shows one pixel of a plurality of pixels formed on the liquid crystal display. Also, a fourth thin film transistor substrate 53 in FIG. 16 includes the first thin film transistor TR1 (shown in FIG. 1) arranged thereon. Thus, the same reference numerals denote the same elements in FIG. 1, and thus the detailed descriptions of the same elements will be omitted.

Although not shown in FIG. 16, the fourth thin film transistor substrate 53 may include the second thin film transistor TR2 (shown in FIG. 2) arranged in lieu of the first thin film transistor TR1.

Referring to FIG. 16, a liquid crystal display 501 includes the fourth thin film transistor substrate 53, a color filter substrate 410, and a liquid crystal 250 disposed between the color filter substrate 410 and the fourth thin film transistor substrate 53.

The fourth thin film transistor substrate 53 includes a first thin film transistor TR1 and a pixel electrode PE that is electrically connected to the first thin film transistor TR1. The pixel electrode PE is electrically connected to a first drain electrode DE1 of the first thin film transistor TR1 through a fourth contact hole CH4.

The color filter substrate 410 includes a base substrate 401, a black matrix BM, a color filter CF, and a common electrode 300. The black matrix BM is arranged on the base substrate 401 to face the first thin film transistor TR1. The color filter CF is arranged on the base substrate 401 and the black matrix BM, and the common electrode 300 is arranged on the color filter CF.

According to the above, the semiconductor pattern that defines the channel area is formed together with the etch stop layer using the same mask pattern, thereby reducing the number of patterning processes. In addition, when the etch stop layer is formed (after forming the semiconductor pattern), the semiconductor pattern may be prevented from being over-etched during etching of the etch stop layer. This in turn prevents deterioration of operational characteristics of the TFT.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A thin film transistor substrate comprising:
   a substrate;
   a lower semiconductor pattern arranged on the substrate;
   an etch stop layer arranged on the lower semiconductor pattern;
   an upper semiconductor pattern arranged on the etch stop layer;
   a source electrode arranged on the upper semiconductor pattern;
   a drain electrode arranged on the upper semiconductor pattern and spaced apart from the source electrode; and
   a gate electrode arranged on or under the lower semiconductor pattern to overlap the lower semiconductor pattern;
   wherein the lower semiconductor pattern has a same shape as the etch stop layer in a plan view, and
   wherein the upper semiconductor pattern contacts a side portion of the lower semiconductor pattern.

2. The thin film transistor substrate of claim 1, further comprising an ohmic contact pattern arranged on the upper semiconductor pattern.

3. The thin film transistor substrate of claim 2, wherein the ohmic contact pattern has a same shape as the upper semiconductor pattern in a plan view.

4. The thin film transistor substrate of claim 1, wherein the upper semiconductor pattern and the lower semi-conductor pattern comprise crystalline silicon.

5. The thin film transistor substrate of claim 1, wherein the upper semiconductor pattern comprises an impurity-doped semiconductor material.

6. A display apparatus comprising:
   a first substrate;
   a second substrate facing the first substrate;
   a thin film transistor arranged on the first substrate; and
   a pixel arranged on the first substrate and electrically connected to the thin film transistor;
   wherein the thin film transistor comprises:
      a lower semiconductor pattern arranged on the first substrate;
      an etch stop layer arranged on the lower semiconductor pattern;
      an upper semiconductor pattern arranged on the etch stop layer;
      a source electrode arranged on the upper semiconductor pattern;
      a drain electrode arranged on the upper semiconductor pattern and spaced apart from the source electrode; and
      a gate electrode arranged on or under the lower semiconductor pattern to overlap the lower semiconductor pattern; and
   wherein the lower semiconductor pattern has a same shape as the etch stop layer in a plan view,
   wherein the upper semiconductor pattern contacts a side portion of the lower semiconductor pattern.

7. The display apparatus of claim 6, wherein the thin film transistor further comprises an ohmic contact pattern arranged on the upper semiconductor pattern.

8. The display apparatus of claim 7, wherein the ohmic contact pattern has a same shape as the upper semiconductor pattern in a plan view.

9. The display apparatus of claim 6, wherein the upper semiconductor pattern and the lower semiconductor pattern comprise crystalline silicon.

10. The display apparatus of claim 6, wherein the pixel comprises an organic light emitting layer that is electrically connected to the drain electrode.

11. The display apparatus of claim 6, further comprising a liquid crystal disposed between the first substrate and the second substrate, and wherein the pixel comprises a pixel electrode that is electrically connected to the drain electrode.

* * * * *